Figure 1:
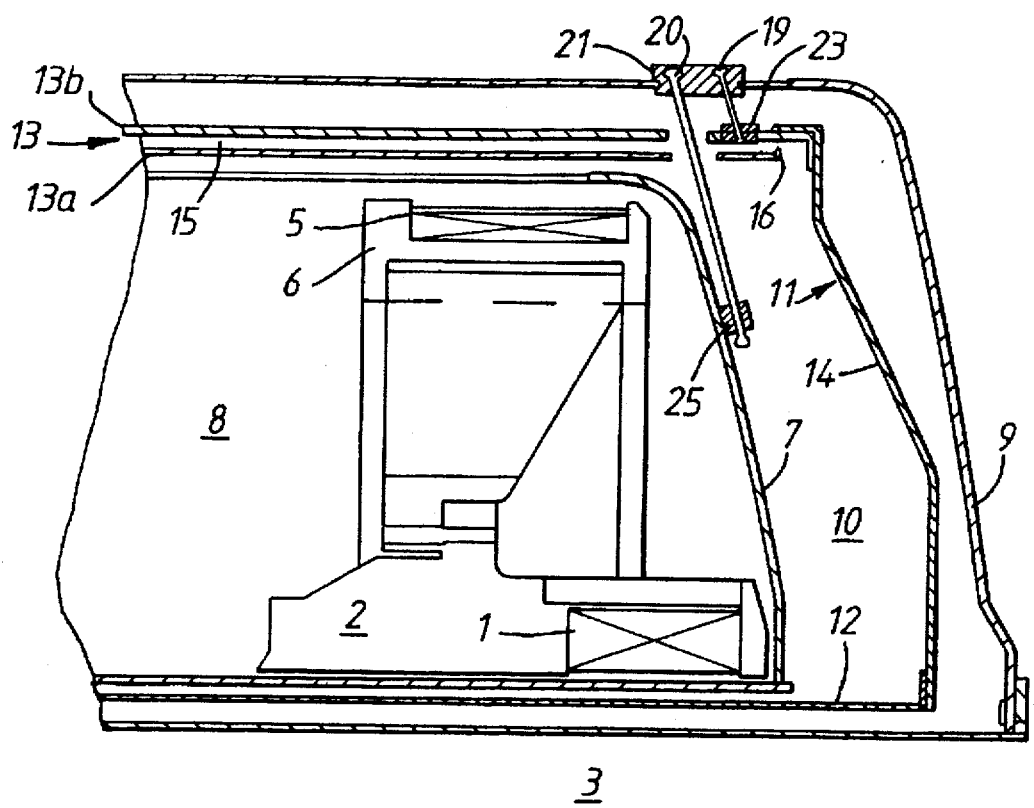

United States Patent [19]
Gore et al.

[11] Patent Number: 5,691,678
[45] Date of Patent: Nov. 25, 1997

[54] ELECTROMAGNETS

[75] Inventors: Russell Peter Gore, Abingdon; Graham Gilgrass, Sutton, both of England

[73] Assignee: Oxford Magnet Technology Limited, Eynsham, England

[21] Appl. No.: 502,957

[22] Filed: Jul. 17, 1995

[30] Foreign Application Priority Data

Jul. 28, 1994 [GB] United Kingdom .................. 9415188

[51] Int. Cl.⁶ .................................................. H01F 1/00
[52] U.S. Cl. ............................ 335/216; 335/216; 335/297; 335/301
[58] Field of Search ..................... 335/216, 297, 335/299, 301; 324/318

[56] References Cited

U.S. PATENT DOCUMENTS 4,651,117  3/1987  Kawaguchi et al. .
4,986,077  1/1991  Saho et al. ........................ 250/352
5,359,310  10/1994 Pissanetzky ....................... 335/301
5,406,204  4/1995  Morich et al. ..................... 324/318
5,539,367  7/1996  Xu et al. .......................... 335/301

*Primary Examiner*—Lincoln Donovan
*Attorney, Agent, or Firm*—Keck, Mahin & Cate

[57] ABSTRACT

A superconducting electromagnet comprising an annular inner helium container vessel within which the windings of an annular magnet are contained, an outer annular vacuum chamber within which the said inner vessel is contained, and a generally annular hollow thermal shield arranged to enclose the inner vessel and disposed between the said vessel and the said chamber in spaced apart relationship so that the longitudinal axes of the said shield and the magnet are substantially co-extensive, an outer wall of the shield being defined by concentric generally cylindrical mutually spaced inner and outer thermal screens, which in combination define a double wall screen, the shield having a double wall only in a region concentric with the longitudinal axis of the magnet.

6 Claims, 1 Drawing Sheet

ELECTROMAGNETS

This invention relates to superconducting electromagnets and more especially it relates to such magnets for use in magnetic resonance imaging (MRI) systems.

In order to maintain the very low temperature necessary for superconducting electromagnets, i.e. about 4° K., the magnet windings are immersed in liquid helium contained in a cryostat vessel. Effective insulation of the vessel is very important to avoid 'heat gain' and consequential loss of valuable helium which tends to boil off at a rate dependent on the effectiveness of the insulation.

In order to provide for good insulation, it is known to contain the vessel within an evacuated chamber which serves to minimise losses due to convection and additionally to provide a heat shield within the chamber which serves to minimise losses due to radiation. The construction of the chamber and its associated heat shield affect the overall size of the magnet as well as its thermal efficiency. Moreover, active magnetic shielding requirements and the cost associated with its provision, tend to be affected by the internal dimensions of the magnet necessary to accommodate the heat shield.

It is an object of the present invention to provide a superconducting magnet assembly which facilitates the provision of good thermal insulation and effective magnet shielding, cost effectively.

According to the present invention, a superconducting electromagnet comprises an annular inner helium container vessel within which the windings of an annular magnet are contained, an outer annular vacuum chamber within which the said inner vessel is contained, and a generally annular hollow thermal shield arranged to enclose the inner vessel and disposed between the said vessel and the said chamber in spaced apart relationship so that the longitudinal axes of the said shield and the magnet are substantially co-extensive, an outer wall of the shield being at least partly defined by generally cylindrical mutually spaced inner and outer thermal screens, which in combination define a double wall screen, the inner wall of the shield being defined by a thermal screen having a single cylindrical wall which is concentric with the longitudinal axis of the magnet.

By arranging that the cylindrical outer wall of the shield is the only part of the shield which comprises a double wall screen, thermal shielding can effectively be maintained whilst enabling the overall diameter of the electromagnet to be reduced. Alternatively, either the separation between magnetising and shielding coils of the magnet can be increased, whereby the cost of providing effective active magnetic shielding can be reduced as will hereinafter be more fully explained, or the diameter of the patient bore can be increased improving patient access and comfort, or combinations of all three.

The outer of the two thermal screens may be joined by a pair of generally annular end caps to an inner cylindrical wall, thereby to define the generally annular hollow thermal shield.

The inner of the two cylindrical screens may be provided at each end thereof with a lip which is arranged to extend generally orthogonally of its longitudinal axis so as effectively to block both ends of a cylindrical space between the screens whereby heat gain is further reduced.

The two screens may comprise heat conductive material and may be conductively coupled to refrigerator means.

The two screens may be fabricated and assembled as a single unit.

The space between the shield and the chamber may be at least partly filled with insulative material.

The shield may be secured to a wall of the chamber by means of elongate support members.

Figure 2:
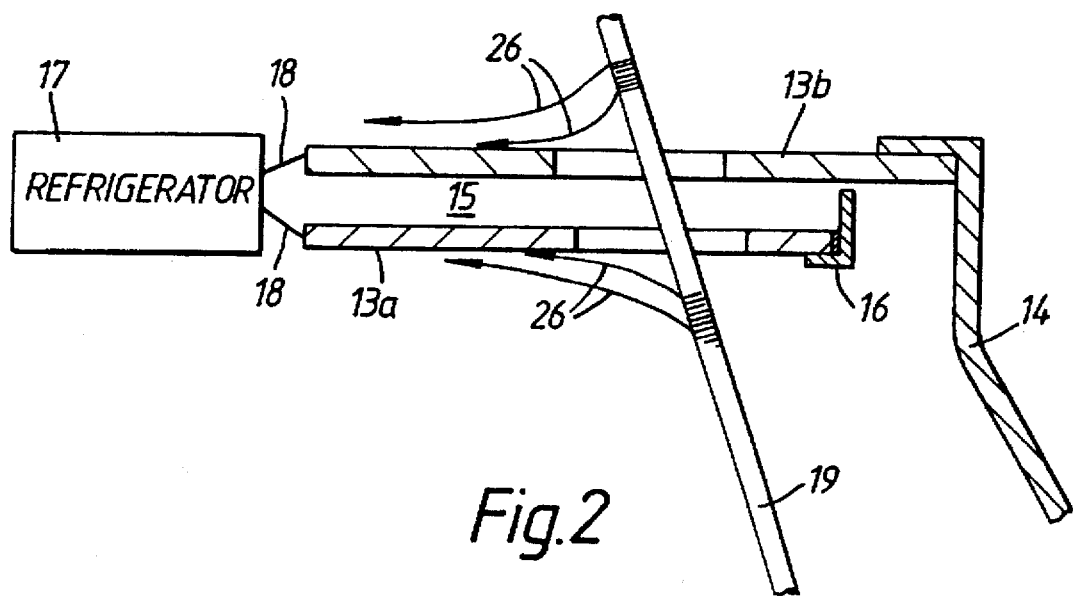

One embodiment of the invention will now be described by way of example only, with reference to the accompanying drawings in which, FIG. 1 is a somewhat schematic sectional side view of a part of a superconducting magnet assembly;

FIG. 2 is an enlarged sectional side view showing a part of the assembly shown in FIG. 1 in greater detail.

Referring now to FIG. 1, a superconducting magnet assembly for use in an MRI system, comprises a magnetising winding 1 which is carried on a former 2. The winding 1 is in use energised to produce a predetermined magnetic field in a cylindrical bore region 3, the assembly shown being symmetrical about a centre line 4 which corresponds to the longitudinal axis of the magnet assembly. In order to partly cancel the effect of magnetic fields produced consequent upon energisation of the winding 1 in regions surrounding the magnet assembly, a shielding winding 5 is provided supported on a former 6, the shielding winding being energised to produce a magnetic field in opposition to the field produced when the winding 1 is energised.

The windings 1 and 5 are contained within a generally annular vessel 7, a space 8 between the windings 1 and 5 and the vessel 7 being filled with liquid helium. The vessel 7 is contained within a generally annular chamber 9, a space 10 between the vessel 7 and the chamber 9 being evacuated to limit heat loss by convection.

In order to minimise heat loss by radiation, a generally annular shield 11 is provided having an inner cylindrical wall 12, an outer cylindrical wall 13, and annular end caps 14, one only of which is shown in the drawing, which serve to close the space between the walls 12 and 13 at each end thereof.

In order to minimise radiation losses, the outer cylindrical wall 13 is arranged to be a double wall comprising inner and outer cylindrical thermal screens 13a and 13b, respectively, which are concentric with the longitudinal axis 4 of the magnet.

In order to prevent radiant heat entering a space 15 between vessels 14 and 7 by reflection between the inner and outer screens 13a and 13b respectively, lip portions 16 are provided on each end of the inner screen 13a, one only being shown in the drawing. The construction of one of the lip portions 16 can more clearly be seen from FIG. 2 which bears the same numerical designations as in FIG. 1.

In order still further to improve insulation, the screens 13a and 13b are conductively coupled to a refrigerator 17 by means of conductive links 18 which are shown schematically in the drawings by means of broken lines.

As shown most clearly in FIG. 1, which is generally schematic, the vessel 7, the shield 11, which is defined by the parts 12, 13a, 13b, 14 and the chamber 9, are spaced apart from each other, whereby heat is not gained through conduction. This spaced apart relationship is achieved at least in part by means of suspension rods 19 and 20 made of possibly stainless steel and fibre glass rod respectively (only one of each of which is shown). The rods 19 and 20 are anchored at one end thereof in a strengthened support boss 21 which is set into a wall 21a of the chamber 9. The rod 19 is arranged to support the shield 11 through an anchor block 23 which is connected to the outer shield 13b which forms a part of the shield 11.

The rod 20 is arranged to project through apertures 24 in the shields 13a, 13b and to be connected to an anchor block 25 secured to the vessel 7.

As shown schematically in FIG. 2, in order to minimise heat gain via the rods 19 and 20, heat shunting straps 26 are provided which serve thermally to couple the rods to the refrigerated screens 13a and 13b.

An important constructional feature of the assembly is that the inner screen 13a is secured to the outer screen 13b whereby the cylindrical wall 13 comprising these two parts can be assembled as a single unit.

For simplicity, one part only of the assembly is shown in the drawing which includes two suspension rods 19 and 20 only. It will however be appreciated that a plurality of such rods are used to provide radial suspension at each end of the magnet assembly.

Various modifications may be made to the arrangements shown without departing from the scope of the invention and for example additional insulative support and spacing blocks may be provided as appropriate between various parts of the assembly in order to satisfactorily maintain the required spaced apart relationship.

In order to provide for minimum heat losses, such spacing blocks will normally be fabricated from an insulative material and additionally, may be shaped so as to minimise points of contact between the blocks and regions with which they make contact.

Additionally, insulation may be used in evacuated spaces such as for example, between the shield 11 and the chamber 9.

By using a heat shield, the outer cylindrical wall only of which is manufactured as a compact, double unit, the overall diameter of the magnet may be reduced and/or the spacing between the windings 1 and 5 increased. This latter feature facilitates the fabrication of a shield winding having less turns and this can represent a considerable cost saving. Additionally, or alternatively, the provision of MRI apparatus having a larger bore is facilitated, with improved patient access and comfort and furthermore the spacing between the shells of the outer shield assembly may be reduced as compared with previously known systems. Further advantages stem from the simplified construction techniques which afford significant cost savings without significant degradation in performance or increase in operating costs.

We claim:

1. A superconducting electromagnet comprising:

an annular inner helium container vessel, windings of an annular magnet contained within said inner vessel, an outer annular vacuum chamber within which the inner vessel is contained, and a generally annular hollow thermal shield enclosing the inner vessel and disposed between said inner vessel and said outer annular vacuum chamber in spaced apart relationship so that longitudinal axes of said shield and the magnet are substantially co-extensive, an outer wall of the shield being at least partly defined by generally cylindrical mutually spaced inner and outer thermal screens which, in combination, define a double wall screen, an inner wall of the shield being defined by an additional thermal screen having a single cylindrical wall which is concentric with the longitudinal axis of the magnet, the outer thermal screen being joined by a pair of generally annular end caps to the inner wall of the shield, and the inner thermal screen being axially spaced apart from the pair of end caps.

2. An electromagnet as claimed in claim 1, wherein the inner thermal screen is provided at each end thereof with a lip which is arranged to extend generally orthogonally of its longitudinal axis so as effectively to block both ends of a cylindrical space between the inner and outer thermal screens.

3. An electromagnet as claimed in claim 1, wherein the inner and outer thermal screens comprise heat conductive material and are conductively coupled to refrigerator means.

4. An electromagnet as claimed in claim 1, wherein the inner and outer thermal screens are assembled as a single unit.

5. An electromagnet as claimed in claim 1, wherein a space defined between the shield and the chamber is at least partly filled with insulative material.

6. An electromagnet as claimed in claim 1, wherein the shield is secured to a wall of the chamber by elongate support members.

* * * * *